(12) United States Patent
Cheng et al.

(10) Patent No.: US 9,881,937 B2
(45) Date of Patent: Jan. 30, 2018

(54) PREVENTING STRAINED FIN RELAXATION

(71) Applicant: International Business Machines Corporation, Armonk, NY (US)

(72) Inventors: Kangguo Cheng, Schenectady, NY (US); Bruce B. Doris, Slingerlands, NY (US); Hong He, Schenectady, NY (US); Sivananda K. Kanakasabapathy, Niskayuna, NY (US); Gauri Karve, Cohoes, NY (US); Juntao Li, Cohoes, NY (US); Fee Li Lie, Albany, NY (US); Derrick Liu, Albany, NY (US); Chun Wing Yeung, Niskayuna, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/397,170

(22) Filed: Jan. 3, 2017

(65) Prior Publication Data
US 2017/0117300 A1    Apr. 27, 2017

Related U.S. Application Data

(62) Division of application No. 14/722,237, filed on May 27, 2015, now Pat. No. 9,576,979.

(51) Int. Cl.
| | | |
|---|---|---|
| H01L 27/12 | (2006.01) | |
| H01L 29/66 | (2006.01) | |
| H01L 21/308 | (2006.01) | |
| H01L 21/84 | (2006.01) | |
| H01L 29/161 | (2006.01) | |
| H01L 29/78 | (2006.01) | |

(52) U.S. Cl.
CPC ........ *H01L 27/1211* (2013.01); *H01L 21/308* (2013.01); *H01L 21/845* (2013.01); *H01L 29/161* (2013.01); *H01L 29/6656* (2013.01); *H01L 29/66795* (2013.01); *H01L 29/7849* (2013.01)

(58) Field of Classification Search
CPC ............. H01L 27/1211; H01L 29/6653; H01L 29/6656; H01L 27/308
See application file for complete search history.

(56) References Cited

U.S. PATENT DOCUMENTS

| | | |
|---|---|---|
| 8,003,466 B2 | 8/2011 | Shi et al. |
| 8,569,152 B1 | 10/2013 | Basker et al. |
| 2016/0351590 A1 | 12/2016 | Cheng et al. |

OTHER PUBLICATIONS

List of IBM Patents or Patent Applications Treated as Related, dated herewith.

*Primary Examiner* — Thanh V Pham
(74) *Attorney, Agent, or Firm* — Matthew C. Zehrer

(57) ABSTRACT

A semiconductor structure includes a first strained fin portion and a second strained fin portion, a pair of inactive inner gate structures upon respective strained fin portions, and spacers upon outer sidewalls surfaces of the inactive inner gate structures, upon the inner sidewall surfaces of the inactive inner gate structures, and upon the first strained fin portion and the second strained fin portion end surfaces. The first strained fin portion and the second strained fin portion end surfaces are coplanar with respective inner sidewall surfaces of the inactive inner gate structures. The spacer formed upon the end surfaces limits relaxation of the first strained fin portion and the second strained fin portion and limits shorting between the first strained fin portion and the second strained fin portion.

10 Claims, 5 Drawing Sheets

PREVENTING STRAINED FIN RELAXATION

BACKGROUND

Field of the Invention

The present invention generally relates to integrated circuits, and more particularly to the prevention of strained fin relaxation within FinFET semiconductor devices.

Background of Invention

A FinFET device includes a fin formed in a wafer and a gate covering a portion of the fins. The portion of the fin covered by the gate serves as a channel region of the device and portions of the fins extending out from under the gate serve as source and drain regions of the device.

Strained fins formed from strained material may be useful due to high carrier mobility. Maintaining the strain in the material of the strain fin is important to maintain the mobility benefits. However, it has been determined that the strained material at the fin ends may relax. The material relaxation may propagate from the fin ends to the fin center, resulting in mobility benefit reduction and variable FinFET device performance.

SUMMARY

According to one embodiment of the present invention, a semiconductor structure fabrication method includes forming a strained fin from a strained multilayered substrate, forming a pair of inactive inner gate structures upon the strained multilayered substrate and upon the strained fin, separating the strained fin into fin portions by removing strained fin material between the inactive inner gate structures, the separation of the strained fin exposing fin portion ends coplanar with respective inner sidewall surfaces of the inactive inner gate structures, and forming spacers upon outer sidewalls surfaces of the inactive inner gate structures, upon the inner sidewall surfaces of the inactive inner gate structures, and upon the exposed fin portion ends.

In another embodiment, a semiconductor structure includes a first strained fin portion and a second strained fin portion upon a multilayered substrate, a pair of inactive inner gate structures upon the multilayered substrate and upon respective strained fin portions, wherein the first strained fin portion and the second strained fin portion end surfaces are coplanar with respective inner sidewall surfaces of the inactive inner gate structures, and spacers upon outer sidewalls surfaces of the inactive inner gate structures, upon the inner sidewall surfaces of the inactive inner gate structures, and upon the first strained fin portion and the second strained fin portion end surfaces.

In another embodiment, the semiconductor structure is included within a design structure embodied in a machine readable storage medium for designing, manufacturing, or testing an integrated circuit.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates to the fabrication of FinFET devices, and more particularly, to preventing strained fin relaxation at the fin ends. The embodiments may be implemented in a gate first or a gate last FinFET fabrication process flow, however a gate last, or replacement gate (RG), process flow will be relied upon for the detailed description below.

In a general RG process flow, a semiconductor substrate may be patterned and etched to form fins. Next, a sacrificial gate structure may be formed in a direction perpendicular to the length of the fins. For example, the sacrificial gate structure may be pattered and etched from a blanket layer of polysilicon. A pair of spacers can be disposed on opposite sidewalls of the sacrificial gate structure. Later, the sacrificial gate structure may be removed from between the pair of spacers, as by, for example, an anisotropic vertical etch process such as a reactive ion etch (RIE). This creates an opening between the spacers where a replacement metal gate may then be formed. Typical integrated circuits may be divided into active areas and non-active areas. The active areas may include FinFET devices. Each active area may have a different pattern density, or a different number of FinFET devices.

Figure 1:
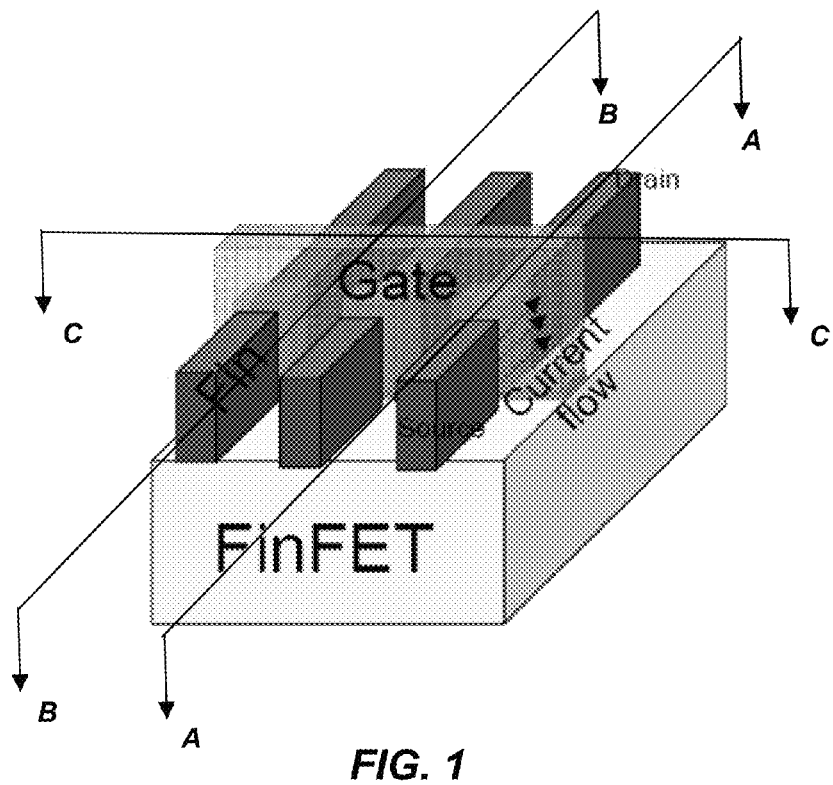
FIG. 1 illustrates an exemplary FinFET device that may embody one or more aspects of the present invention.

Referring now to FIG. 1, an exemplary FinFET device includes fins formed upon a substrate and a gate formed upon the substrate and upon and surrounding a portion of the fins. The portion of the fin covered by the gate serves as a channel region of the device and portions of the fins extending out from under the gate serve as source and drain regions of the device. It should be noted that FIG. 2A-FIG. 5B represent a cross section view of a semiconductor structure, such as a wafer, IC chip, etc. having a plurality of fins formed upon a semiconductor substrate. Cross section AA is a gate cross section view along the length of a fin. Cross section BB is a gate cross section view along the length between adjacent fins. Cross section CC is a fins cross section along the length of the gate. Furthermore, it should be noted that while this description may refer to some components of the semiconductor structure in the singular tense, more than one component may be depicted throughout the figures and like components are labeled with like numerals. The specific number of fins depicted in the figures is for illustrative purposes only.

Figure 2A:
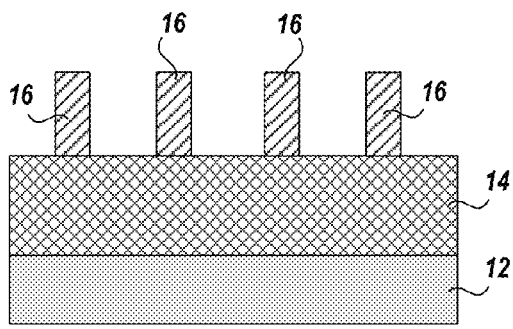
FIG. 2A-FIG. 2B illustrates a semiconductor structure at an intermediate fabrication stage, according to an exemplary embodiment.
Figure 2B:
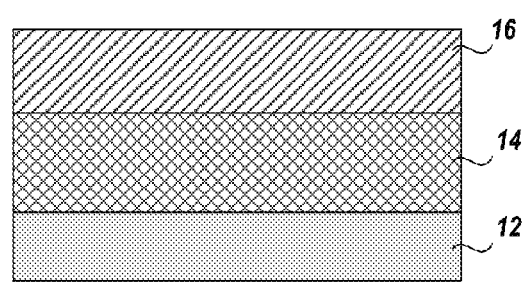

Referring now to FIG. 2A depicting a CC cross section view of a semiconductor structure 100 at an intermediate fabrication stage and to FIG. 2B, a AA cross section view of the semiconductor structure 100 at the intermediate fabrication stage. At this fabrication stage, the structure 100 may generally include a plurality of fins 16 formed upon a layered substrate including a base substrate 12 and an insulating layer 14 deposited thereon.

In the embodiment shown in FIG. 2A, a SGOI substrate is depicted, however for the purposes of clarity, the various embodiments of the present invention may be applied utilizing a bulk substrate. The SOI substrate may include a base substrate 12, a buried dielectric layer 14 formed on top of the base substrate 12, and a SGOI layer (not shown) formed on top of the buried dielectric layer 14. The buried dielectric layer 14 may isolate the SOI layer from the base substrate 12. It should be noted that the plurality of fins 16 may be etched from the SGOI layer.

The base substrate 12 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 12 may be about, but is not limited to, several hundred microns thick. For example, the base substrate 12 may have a thickness ranging from 0.5 mm to about 1.5 mm.

The insulating layer 14 may include any of several dielectric materials, for example, oxides, nitrides and oxynitrides of silicon. The insulating layer 14 may also include oxides, nitrides and oxynitrides of elements other than silicon. In addition, the insulating layer 14 may include crystalline or non-crystalline dielectric material. Moreover, the insulating layer 14 may be formed using any of several known methods, for example, thermal or plasma oxidation or nitridation methods, chemical vapor deposition methods, and physical vapor deposition methods. The insulating layer 14 may have a thickness ranging from about 5 nm to about 200 nm. In one embodiment, the insulating layer 14 may have a thickness ranging from about 150 nm to about 180 nm.

The SGOI layer, for example the plurality of fins 16, may include any of the several semiconductor materials included in the base substrate 12. In general, the base substrate 12 and the SOI layer may include either identical or different semiconducting materials with respect to chemical composition, dopant concentration and crystallographic orientation. In one particular embodiment of the present invention, the base substrate 12 and the SGOI layer include semiconducting materials that include at least different crystallographic orientations. Typically the base substrate 12 or the SGOI layer include a {110} crystallographic orientation and the other of the base substrate 12 or the SGOI layer includes a {100} crystallographic orientation. In a particular embodiment, the base substrate 12 is silicon and the SGOI layer is silicon germanium.

Typically, the SGOI layer may include a thickness ranging from about 5 nm to about 100 nm. In one embodiment, the SGOI layer may have a thickness ranging from about 25 nm to about 50 nm. Methods for forming the SGOI layer are well known in the art. Non-limiting examples include SIMOX (Separation by Implantation of Oxygen), wafer bonding, ELTRAN® (Epitaxial Layer TRANsfer), condensation. Such formation techniques may result in the SGOI being strained. The strain level depends on the germanium concentration of the SGOI layer. For example, for fully strained SGOI with 25% Ge %, the compressive strain level is about 1%. It may be understood by a person having ordinary skill in the art that the plurality of fins 16 may be formed from the SGOI layer (by etching, sidewall image transfer, etc.). Because the plurality of fins 16 may be etched from the SGOI layer, they too may include any of the characteristics listed above for the SGOI layer. For clarity, when substrate 12 is a bulk substrate, the plurality of fins 16 may formed on the bulk substrate using known processes (e.g. SiGe epitaxy on Si bulk substrate, etch fins, oxide fill in gaps between fins, and partially recess oxide to reveal the SiGe fin channels, etc.).

Figures 3A, 3B:
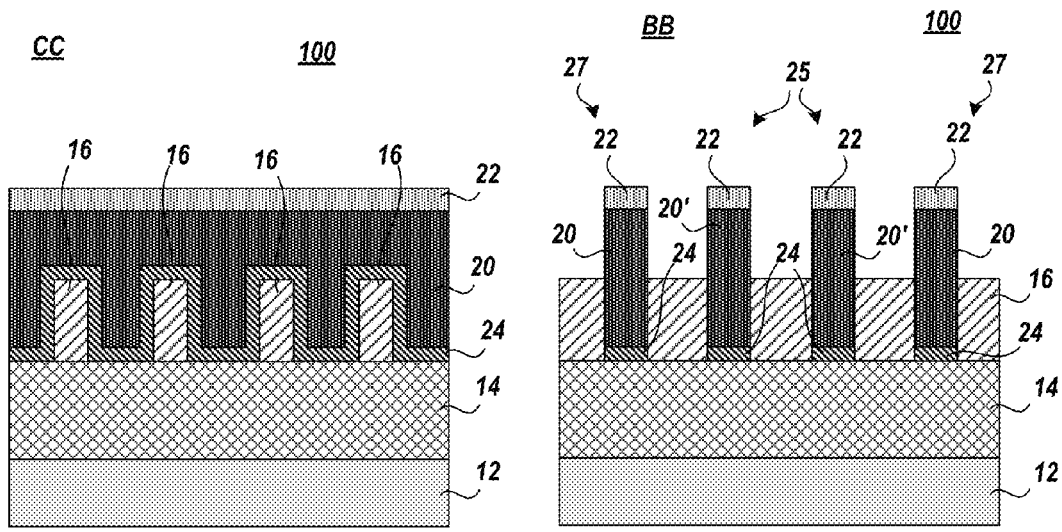
FIG. 3A-FIG. 3B illustrates a semiconductor structure at an intermediate fabrication stage, according to an exemplary embodiment.

Referring now to FIG. 3A depicting a CC cross section view of semiconductor structure 100 at an intermediate fabrication stage and to FIG. 3B, a BB cross section view of the semiconductor structure 100 at the intermediate fabrication stage. At this fabrication stage, the structure 100 may generally include a plurality of gate structures are formed upon the substrate and upon and surrounding the fins 16.

If a gate-first process as described above is employed, the gate structures (not shown) may comprise a gate dielectric (e.g., high-k such as hafnium oxide, etc.), a gate conductor (e.g., metal gate, etc.), a gate cap (e.g., nitride, etc.). Any suitable deposition technique can be used to deposit high-k and metal gate, including but not limited to atomic layer deposition, chemical vapor deposition, physical vapor deposition, sputtering, plating, etc.

If a RG process is employed, a sacrificial gate structure is formed wherein the sacrificial gate structure may comprise a sacrificial gate dielectric 24 (e.g., oxide, etc.) formed upon the insulating layer 14 covering and surrounding fins 16, a sacrificial gate 20 (e.g., polysilicon, etc.) on top of the sacrificial gate dielectric 24, and a sacrificial gate cap 22 (e.g., nitride, etc.) on top of the sacrificial gate 20. The gate cap 22 may be a remnant of a masking layer utilizing in the subtractive formation processes (e.g., etching, etc.) utilized to form the gate structures. The sacrificial gate structure is removed in a later process familiar to those of skill in the art and a replacement metal gate composition is patterned at an appropriate stage of the transistor fabrication process. The sacrificial gate dielectric 24, sacrificial gate 20, and the sacrificial gate cap 22 may be formed using any of several known methods, for example, thermal or plasma oxidation or nitration methods, chemical vapor deposition methods, physical vapor deposition methods, etc. followed by subtractive techniques (e.g., etching, etc.) that remove portions of the gate structure materials and retaining the gate structures in desired locations as is known in the art.

Gate structure fabrication results in at least a pair of inner inactive gate structures 25 and may further result in one or more outer gate structures 27 located outside of the inactive gate structures 25. Gate structures 25 are inactive gate structures in that they are not associated with an active FinFET device, but rather, utilized in fabrication stages to cut or otherwise separate fins 16. Gate structures 27, when formed a sacrificial gate structure is associated with an eventual active RG or metal gate, and when a RG or metal gate are associated with an active FinFET device wherein when current is applied to the gate, current flows between the source and the drain of the FinFET as is known.

Figure 4:
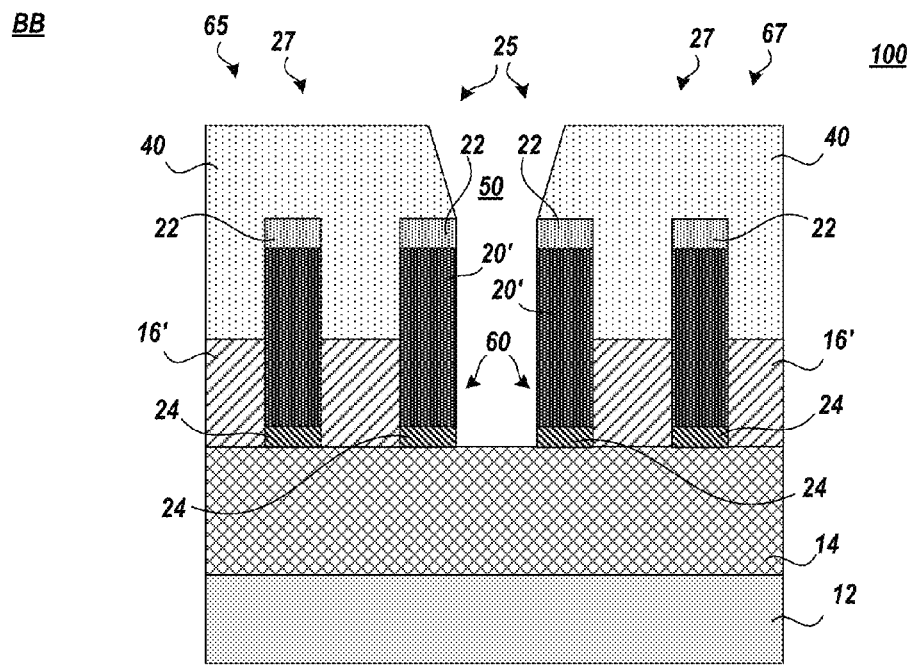
FIG. 4 illustrates a semiconductor structure at an intermediate fabrication stage, according to an exemplary embodiment.

Referring now to FIG. 4 depicting a BB cross section view of semiconductor structure 100 at an intermediate fabrication stage. At this fabrication stage, the structure 100 fins 16 are cut or otherwise separated.

A fin-cut mask 40 is formed as a blanked layer upon structure 100. For example, fin-cut mask 40 is deposited upon the insulating layer 14, the fins 16, and the gate structures to a thickness greater than the height of the gate structures. The cut mask may comprise photoresist in some embodiments, and may be formed by applying a layer of photoresist over the device, exposing the layer of photoresist to light through a mask, and removing the portions of the photoresist that were exposed to the light. In other embodiments, the cut mask my comprise spin-on-glass that is patterned using lithography and etching. The fin-cut mask 40 may be formed using any of several known methods, for example, thermal or plasma oxidation or nitration methods, chemical vapor deposition methods, physical vapor deposition methods, etc.

A trench 50 is formed within the fin-cut mask 40 generally between inactive inner gates 25 utilizing subtractive removal techniques (wet etch, dry etch, etc.) self-aligned to the inner gates 25. In addition to removing the fin-cut mask 40 material between the inner gates 25, the self-aligned subtractive removal technique further removes the fins 16 between inner gates 25 thereby cutting or otherwise separating fins 16 into fin portions 16'. The insulating layer 14 may but utilized as a stopping layer in the self-aligned subtractive removal processes to define insulating layer 14 as the lower surface of trench 50. The self-aligned subtractive removal technique may be a single stage wherein fin-cut mask 40 material and the fin 16 material are removed in the same stage or utilize multiple stages wherein fin-cut mask 40 material is first removed selective to the fin 16 material in a first stage and the fin 16 material is removed in a second stage.

In some embodiments, the self-aligned subtractive removal technique may further remove gate structure material of inactive inner gates 25, thereby thinning the gate structures of inactive inner gates 25. In other words, subsequent to the self-aligned subtractive removal technique that forms trench 50, the width of respective inactive inner gates 25 may be less than the width of respective outer gates 27.

The self-aligned subtractive removal technique that forms trench 50, further exposes respective ends 60 of fin portions 16'. The ends 60 of fin portions 16' are tucked under the inactive inner gates 25. In other words, the end 60 surface of respective fin portions 16' are coplanar with associated inner sidewall surfaces of the inactive inner gates 25.

The separating of fins 16 may generally form multiple areas of structure 100. For example, a first area 65 and a second area 67 may be formed. Subsequent fabrication stages may be performed to generally form a FinFET in first area 65 and forming a FinFET in the second area 67 electrically isolated from the FinFET in first area 65.

Figure 5A:
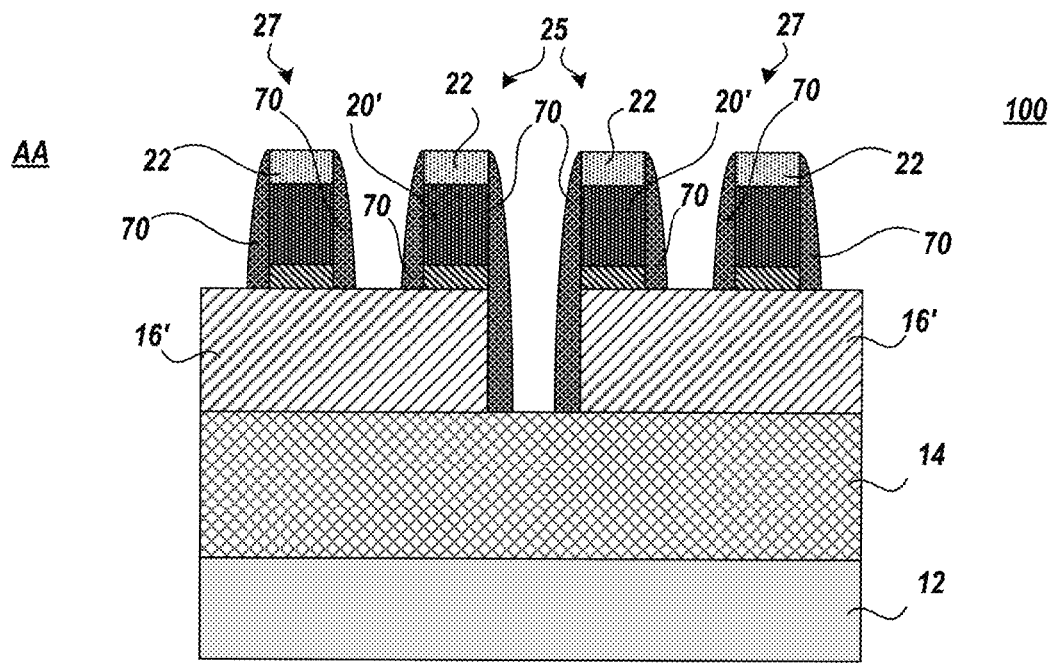
FIG. 5A-FIG. 5B illustrates a semiconductor structure at an intermediate fabrication stage, according to an exemplary embodiment.
Figure 5B:
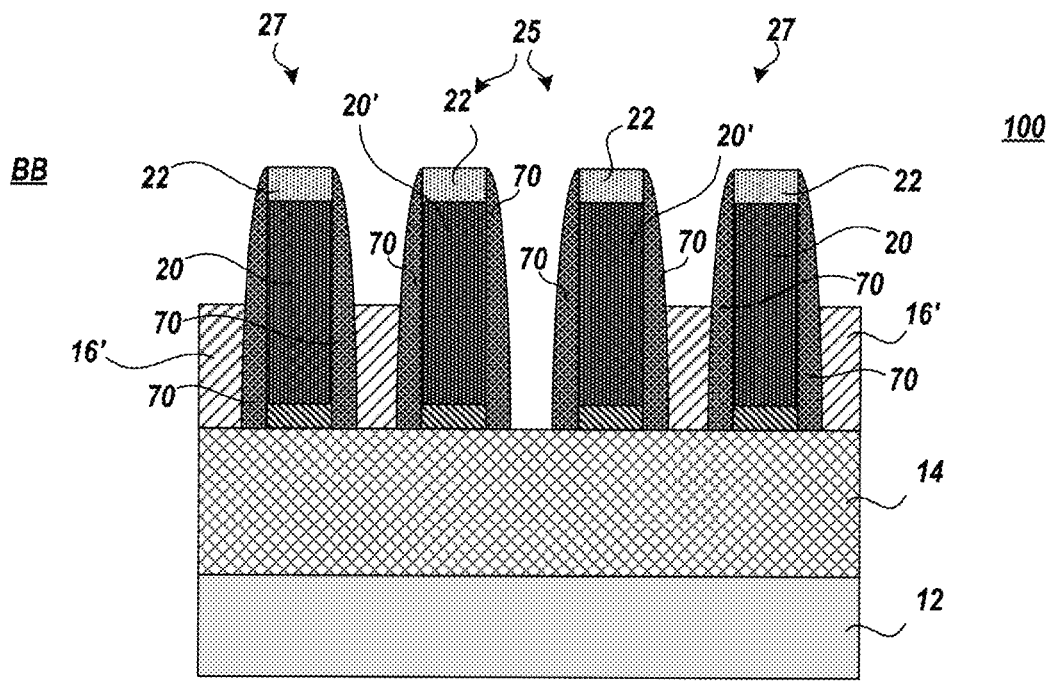

Referring now to FIG. 5A depicting an AA cross section view of semiconductor structure 100 at an intermediate fabrication stage and to FIG. 5B, a BB cross section view of the semiconductor structure 100 at the intermediate fabrication stage. At this fabrication stage, gate structure spacers 70 are formed upon the structure 100.

Spacers 70 may be a dielectric material and may be deposited as a conformal layer covering the gate structure 25 and 27, covering the fins to the extent they extend into or through a source drain region on either side of the gate, and also covering the substrate surface. The process flow is described for the case of this spacer material being silicon nitride but any material that can form a spacer can be used by appropriate process adjustments such as to the etch chemistries. A directional etch such as reactive ion etch (RIE) applied to the conformal spacer layer can remove the spacer materials from horizontal surfaces of the structure 100 while leaving it on the sidewalls of the outer gates 27, the sidewalls or inner gates 25, and exposed fin ends 60. If the gate stack is higher than the fins, then continuing the etch can open the fins, that is, a 'pull-down' etch can remove the spacer material from the fin sidewalls while retaining a narrow spacer 70 on the gate as shown in FIG. 5A. The spacer 70 generally covers or otherwise seals the exposed fin ends 60. The sealing of the fin end 60 prevents the relaxation of the fin portion 16' material. The sealing of the fin end 60 also prevents epitaxial nodules from growing from the fin ends 60 during subsequent source and drain epitaxial growth fabrication stage(s) preventing possible FinFET device shorting between two adjacent FinFETs. As shown in FIG. 5A, the fin ends 60 are tucked under the inactive inner gates 25, such that the side or end 60 surface of respective fin portions 16' are coplanar with associated inner sidewall surfaces of the inactive inner gates 25. In other words, the fin ends 60 are self-aligned to the inner sidewall surfaces of the inactive inner gates 25.

In certain embodiments, the material of fin portions 16' near the fin ends 60 will partially relax prior to the sealing of fin ends 60 by spacers 70. However, the sealing of fin ends 60 generally prevents further relaxation of the material of fin portions 16' such that the material of fin portions 16' under and extend outward from the active outer gates 27 is strained. Thus, carrier mobility benefits gained utilizing strained fins portions 16' are maintained in association with the active outer gates 27.

For clarity, though FIG. 5A and FIG. 5B depict a last intermediate fabrication stage, structure 100 may undergo further fabrication stages such as source/drain formation by epitaxially growing material from the sidewalls of fin portions 16', further FEOL stages, further BEOL, stages, etc. for form a semiconductor device such as an integrated circuit chip.

Figure 6:
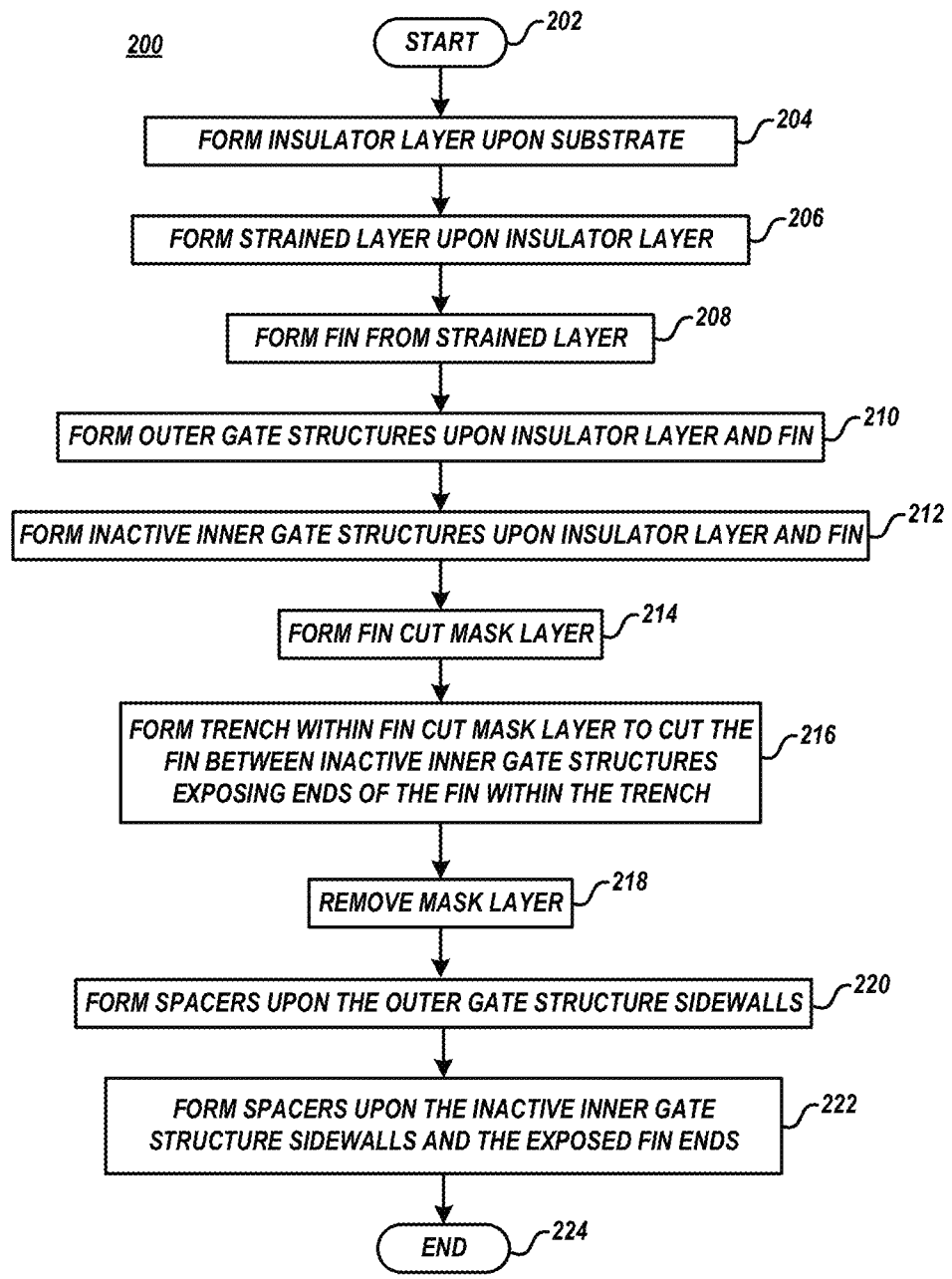
FIG. 6 illustrates a semiconductor structure fabrication method, according to an exemplary embodiment.

Referring now to FIG. 6 depicting an exemplary semiconductor structure 100 fabrication method 200. Method 200 begins at block 202 and begins with forming an insulator layer upon a semiconductor substrate (block 204). For example, base substrate 12 is provided and insulating layer 14 is deposited upon the base substrate 12.

Method 200 may continue with forming a strained layer upon the insulator layer (block 206). For example, a strained SGOI layer is deposited upon the insulating layer 14. Method 200 may continue with forming a fin from the strained layer (block 208). For example, a strained a fin 16 by removing portions of the SGOI layer and retaining the fin 16 in a desired location utilizing a subtractive removal technique such as etching, SIT, etc.

Method 200 may continue with forming outer gate structures upon the insulator and upon the fin (block 210) and with forming inactive inner gate structures upon the insulator and upon the fin (block 212). If a gate-first process is employed, the gate structures may be formed by depositing a gate dielectric (e.g., high-k such as hafnium oxide, etc.), a gate conductor (e.g., metal gate, etc.), and a gate cap (e.g., nitride, etc.). If a RG process is employed, a sacrificial gate structure is formed wherein the sacrificial gate structure may be formed by depositing a sacrificial gate dielectric 24 (e.g., oxide, etc.) upon the insulating layer 14 covering and surrounding fins 16, depositing a sacrificial gate 20 (e.g., polysilicon, etc.) on top of the sacrificial gate dielectric 24, and depositing a sacrificial gate cap 22 (e.g., nitride, etc.) on top of the sacrificial gate 20. The multiple gate structures may be fabricated to form inactive inner gates 25 and one or more outer active gates 27.

Method 200 may continue with forming a fin-cut mask layer (block 214). For example, the fin-cut mask layer 40 may be deposited as a blanket layer upon the insulating layer 14, upon the inactive inner gates 25 and one or more outer active gates 27, and upon the fin 16.

Method 200 may continue with forming a trench within the fin-cut mask layer to cut or separate the fin between the inactive inner gate structures (block 216). The trench that separates the fin results in multiple fin portions and exposes the ends of the fin portion within the trench. For example, trench 50 is formed within the fin-cut mask 40 generally between inactive inner gates 25 utilizing subtractive removal techniques (wet etch, dry etch, etc.) self-aligned to the inner gates 25. In addition to removing the fin-cut mask 40 material between the inner gates 25, the self-aligned subtractive removal technique further removes the fin 16 material between inner gates 25 thereby cutting or otherwise separating fins 16 into fin portions 16'. The self-aligned subtractive removal technique may further remove gate structure material of inactive inner gates 25, thereby thinning the gate structures of inactive inner gates 25 relative to outer gates 27. The self-aligned subtractive removal technique further exposes respective ends 60 of fin portions 16'. The ends 60 of fin portions 16' are tucked under the inactive inner gates 25. In other words, the end 60 surface of respective fin portions 16' are coplanar with associated inner sidewall surfaces of the inactive inner gates 25. Further, the separating of fins 16 may generally form multiple areas of structure 100. For example, a first area 65 and a second area 67 may be formed. Subsequent fabrication stages may be performed to generally form a FinFET within the first area 65 and the second area 67, the FinFETs being electrically isolated.

Method 200 may continue with removing the fin-cut mask layer (block 218) and may continue with forming spacers upon the outer gate structure sidewalls (block 220) and may continue with forming spacers upon the inactive inner gate structure sidewalls and upon the exposed fin ends (block 222). For example, spacers 70 may be deposited upon the sidewalls of the outer gates 27, the sidewalls or inner gates 25, and exposed fin ends 60. The spacer 70 generally covers or otherwise seals the exposed fin ends 60 to prevent the relaxation of the fin portion 16' material. The sealing of the fin end 60 also prevents epitaxial nodules from growing from the fin ends 60 during subsequent source and drain epitaxial growth fabrication stage(s) preventing possible FinFET device shorting between adjacent FinFETs. The sealing of fin ends 60 generally prevents relaxation of the material of fin portions 16' such that the material of fin portions 16' under and extend outward from the active outer gates 27 is strained. Thus, carrier mobility benefits gained utilizing strained fins portions 16' are maintained in association with the active outer gates 27. Method 200 ends at block 224.

Figure 7:
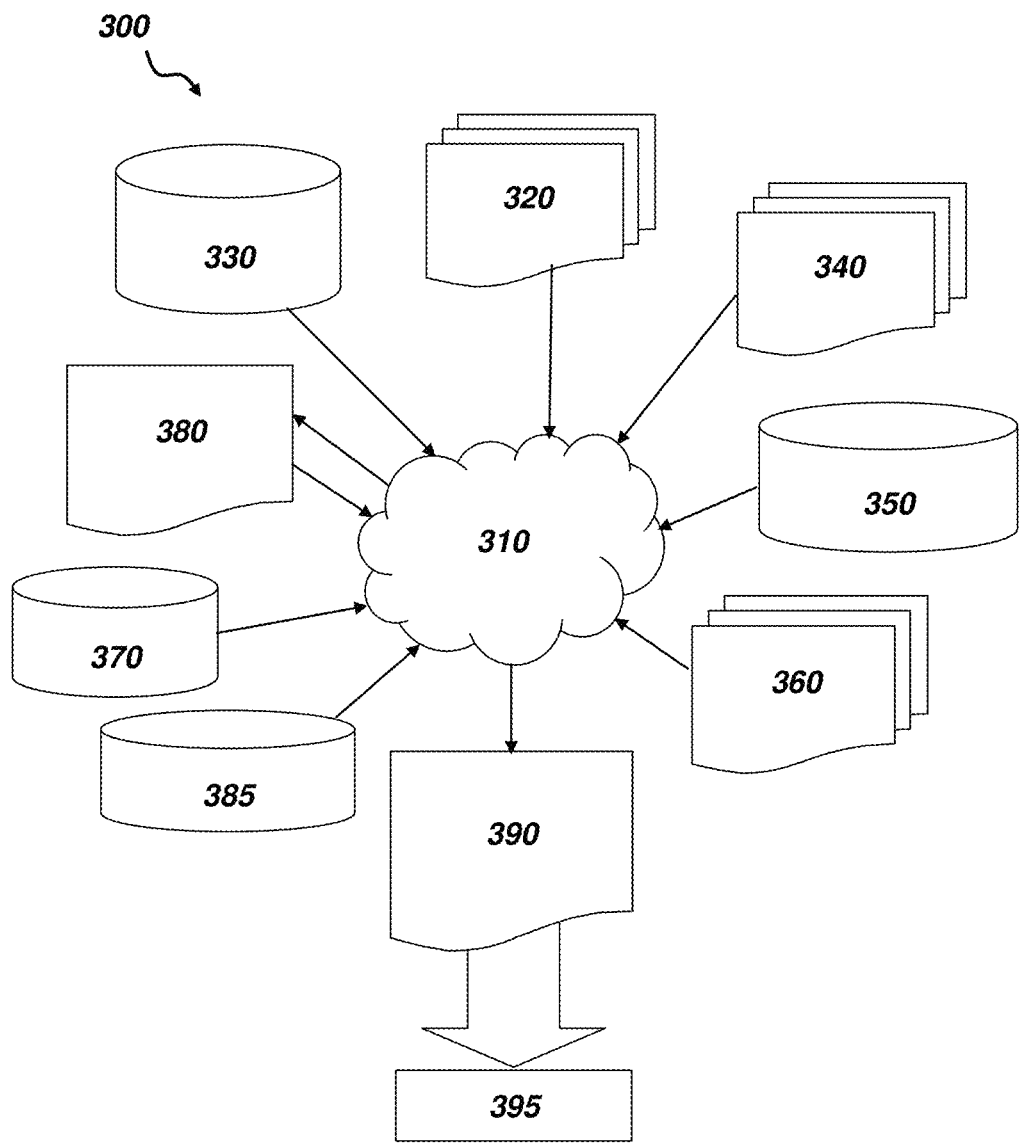
FIG. 7 illustrates a block diagram of an exemplary design flow used in semiconductor integrated circuit logic design, simulation, test, layout, and/or manufacture, according to exemplary embodiments.

Referring now to FIG. 7, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-5B.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-5B. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-5B to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5B. In one embodiment, design structure 390 may comprise a compiled, executable HDL simulation model that functionally simulates the devices shown in FIGS. 1-5B.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5B. Design structure 390 may then proceed to a stage 395 where, for example, design structure 390: proceeds to tape-out, is released to manufacturing, is released to a mask house, is sent to another design house, is sent back to the customer, etc.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above may be used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

Unless described otherwise, or in addition to that described herein, "forming," "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as used herein is defined as a plane parallel to the conventional plane or surface of the substrate 15, regardless of the actual spatial orientation of the semiconductor substrate 15. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. A semiconductor structure comprising:
   a first strained fin portion and a second strained fin portion upon a multilayered substrate;
   a pair of inactive inner gate structures upon the multilayered substrate and upon respective strained fin portions, wherein the first strained fin portion and the second strained fin portion end surfaces are coplanar with respective inner sidewall surfaces of the inactive inner gate structures; and
   spacers upon outer sidewalls surfaces of the inactive inner gate structures, upon the inner sidewall surfaces of the inactive inner gate structures, and upon the first strained fin portion and the second strained fin portion end surfaces.

2. The semiconductor structure of claim 1, wherein the spacer formed upon the first strained fin portion and the second strained fin portion end surfaces limit relaxation of the first strained fin portion and the second strained fin portion.

3. The semiconductor structure of claim 1, wherein the spacer formed upon the first strained fin portion and the second strained fin portion end surfaces limits shorting between the first strained fin portion and the second strained fin portion.

4. The semiconductor structure of claim 1, further comprising:
   one or more outer gate structures upon the strained multilayered substrate and upon the strained fin outside the pair of inactive inner gate structures; and
   spacers upon sidewall surfaces of the one or more outer gate structures.

5. The semiconductor structure claim 1, wherein the pair of the inactive inner gate structures are electrically inactive.

6. The semiconductor structure of claim 4, wherein the one or more outer gate structures are electrically active.

7. The semiconductor structure of claim 4, wherein the fin portion ends are tucked in from respective inner sidewall surfaces of the inactive inner gate structures, and wherein the spacer formed upon the exposed fin portion ends prevent epi nodule formation.

8. The semiconductor structure of claim 4, wherein the one or more outer gate structure comprise a width equal to respective widths of the pair of the inactive inner gate structures.

9. The semiconductor structure of claim 4, wherein the one or more outer gate structure comprise a width greater to respective widths of the pair of the inactive inner gate structures.

10. The semiconductor structure of claim 1, wherein the strained multilayered substrate is a SiGe on insulator (SGOI) substrate.

* * * * *